(12) United States Patent
Bartling et al.

(10) Patent No.: US 7,644,383 B2
(45) Date of Patent: Jan. 5, 2010

(54) METHOD AND SYSTEM FOR CORRECTING SIGNAL INTEGRITY CROSSTALK VIOLATIONS

(75) Inventors: Steven C. Bartling, Plano, TX (US); Marc E. Royer, Garland, TX (US); Charles M. Branch, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 456 days.

(21) Appl. No.: 11/172,284

(22) Filed: Jun. 30, 2005

(65) Prior Publication Data
US 2007/0006109 A1    Jan. 4, 2007

(51) Int. Cl.
*G06F 17/50* (2006.01)
(52) U.S. Cl. ......................................................... 716/6
(58) Field of Classification Search ................. 716/4–6, 716/1, 10, 2, 11
See application file for complete search history.

(56) References Cited

U.S. PATENT DOCUMENTS

| | | | | |
|---|---|---|---|---|
| 5,619,418 A * | 4/1997 | Blaauw et al. .................. | 716/6 |
| 5,719,783 A * | 2/1998 | Kerzman et al. ............... | 716/6 |
| 5,726,903 A * | 3/1998 | Kerzman et al. ............... | 716/2 |
| 6,184,702 B1 | 2/2001 | Takahashi et al. | |
| 6,272,668 B1 * | 8/2001 | Teene ........................... | 716/10 |
| 6,353,917 B1 * | 3/2002 | Muddu et al. .................. | 716/6 |
| 6,493,853 B1 | 12/2002 | Savithri et al. | |
| 6,601,222 B1 * | 7/2003 | Mehrotra et al. ............... | 716/5 |
| 6,637,014 B2 * | 10/2003 | Casavant ........................ | 716/6 |
| 6,701,289 B1 * | 3/2004 | Garnett et al. ................. | 703/14 |
| 6,732,339 B2 | 5/2004 | Savithri et al. | |
| 6,845,494 B2 | 1/2005 | Burks et al. | |
| 6,892,370 B2 | 5/2005 | Flohr | |
| 6,892,373 B2 | 5/2005 | Whitaker et al. | |
| 6,897,497 B2 | 5/2005 | Savaria et al. | |
| 6,901,567 B2 * | 5/2005 | Irie .............................. | 716/5 |
| 6,904,580 B2 | 6/2005 | Teig et al. | |
| 6,904,584 B2 | 6/2005 | Brenner et al. | |
| 6,907,586 B1 * | 6/2005 | Al-Dabagh et al. ............ | 716/5 |
| 6,907,590 B1 * | 6/2005 | Al-Dabagh et al. ............ | 716/6 |
| 6,907,593 B2 | 6/2005 | Teig et al. | |
| 6,910,200 B1 * | 6/2005 | Aubel et al. ................... | 716/9 |
| 7,093,208 B2 * | 8/2006 | Williams et al. ............... | 716/3 |
| 7,111,259 B2 * | 9/2006 | Casavant ....................... | 716/6 |
| 2003/0145296 A1 * | 7/2003 | Chandra et al. ................ | 716/6 |
| 2003/0229873 A1 * | 12/2003 | Casavant ....................... | 716/6 |
| 2004/0111686 A1 * | 6/2004 | Chang et al. ................... | 716/6 |
| 2005/0050496 A1 * | 3/2005 | Kovacs et al. .................. | 716/6 |
| 2005/0278658 A1 * | 12/2005 | Zhang et al. ................... | 716/1 |
| 2006/0259880 A1 * | 11/2006 | Dood et al. .................... | 716/2 |
| 2008/0244474 A1 * | 10/2008 | Turner et al. ................... | 716/2 |

* cited by examiner

*Primary Examiner*—Vuthe Siek
*Assistant Examiner*—Patrick Sandoval
(74) *Attorney, Agent, or Firm*—Dawn V. Stephens; Wade James Brady, III; Frederick J. Telecky, Jr.

(57) ABSTRACT

A system and method for repairing crosstalk delays are disclosed herein. By modeling the change in effective capacitance, one may determine the delay attributable to crosstalk, and upsize cells in the failing net according to a mathematical formula in order to counter the delay.

18 Claims, 4 Drawing Sheets

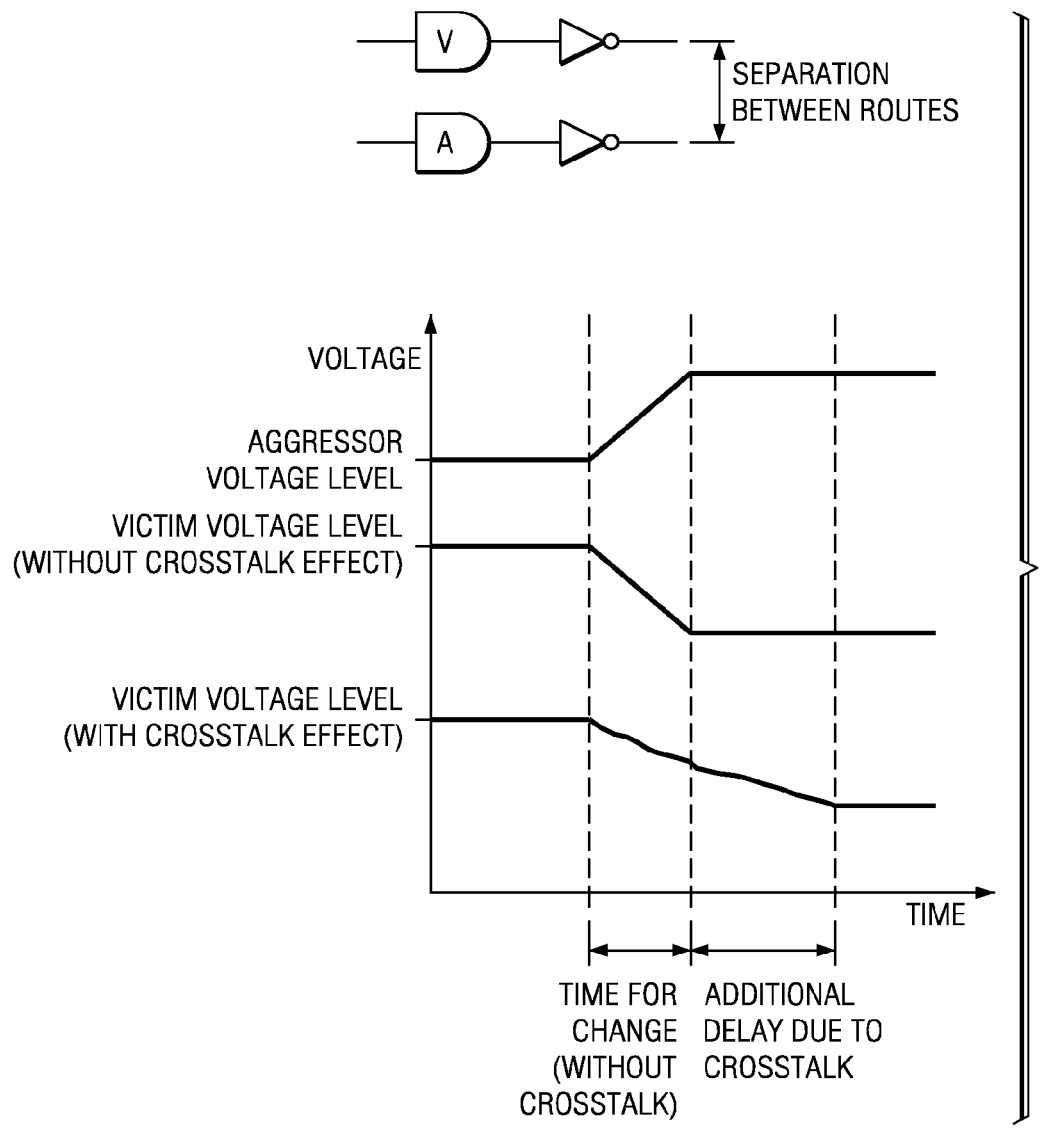

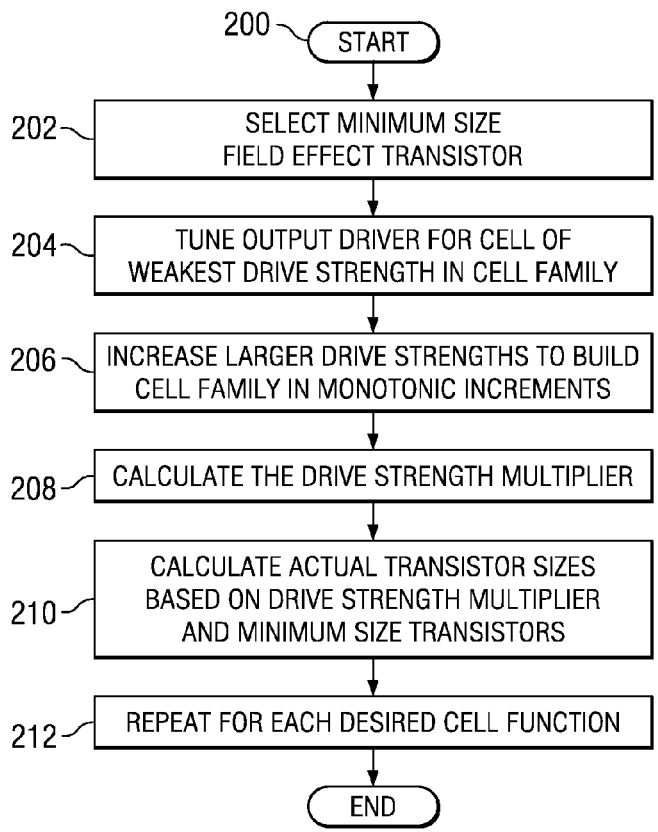
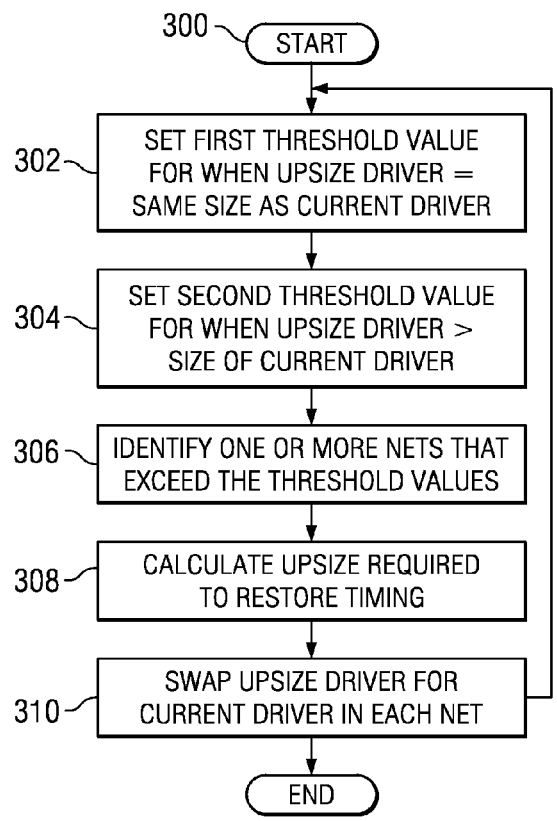

METHOD AND SYSTEM FOR CORRECTING SIGNAL INTEGRITY CROSSTALK VIOLATIONS

CROSS-REFERENCE TO RELATED APPLICATIONS

This application relates to the following commonly assigned co-pending application entitled "Method And System For Desensitization Of Chip Designs From Perturbations Affecting Timing And Manufacturability," Ser. No. 11/171,163, filed Jun. 30, 2005, which is incorporated by reference herein.

BACKGROUND

1. Technical Field

The present subject matter relates to repairing signal integrity. More particularly, the subject matter relates to a system and method for correcting signal integrity crosstalk violations without inducing additional violations.

2. Background Information

An integrated circuit ("IC") is a device that incorporates many electronic components (e.g., transistors, resistors, diodes, etc.). These components are often interconnected to form multiple circuit components (e.g., gates, cells, memory units, arithmetic units, controllers, decoders, etc.) on the IC. The electronic and circuit components of IC's are jointly referred to below as "components." An IC also includes multiple layers of wiring ("wiring layers") that interconnect its components. For instance, many IC's are currently fabricated with metal or polysilicon wiring layers (collectively referred to below as "metal layers") that interconnect its components.

As the conductors between components become more narrow and closer together, and as the time between state transitions decreases (e.g. as the clock speed increases), interference mechanisms that have negligible effects in other applications become limiting. As metal width shrinks, metal resistance increases. To compensate, the metal height is increased so that the cross sectional area of the metal remains large enough to maintain a reasonable resistance value. In older process technologies, the routing capacitance was dominated by the plate capacitance of the route to the layers above and below the metal route. In deep submicron VLSI (with features as small as 0.13 μm and beyond), the plate capacitance now represents one quarter (25%) to one third (33%) of the total capacitance, while sidewall or line-to-line capacitance between routes on the same layer now comprise two thirds (66%) to three quarters (75%) of the routing capacitance.

Crosstalk is one such interference mechanism. Crosstalk is the term used to describe the signal integrity problem caused by coupling capacitance between adjacent wires that run very closely to one another. Energy that is coupled from neighboring signals can produce a significant change in the delay through a "victim" net. A "victim" net is a net on which noise is injected by one or more neighboring nets through cross-coupled capacitance. The nets that inject noise onto a victim net are considered the "aggressor" nets. Crosstalk can result in both logic and delay faults. Logic faults may occur when a victim net is intended to be at a stable value, and an aggressor net injects noise onto the victim net, causing it to glitch. Although the victim net will recover its stable value, the glitch may propagate to a state element, causing a functional failure. Delay faults occur when the victim net and the aggressor net transition simultaneously, or near simultaneously, causing the transition delay of the victim net to be altered (See FIG. 1). Such an altered transition delay may cause a setup or hold time violation. As signal integrity problems are reportedly the primary sources of chip failure in many deep submicron VLSI projects, it is desirable to cure crosstalk violations in a manner that does not create additional violations.

At this time, there is no systematic or algorithmic solution to resolving faults created by signal coupling. Current tools or methods may accurately identify where signal crosstalk exists and the magnitude of crosstalk induced delay, but do not accurately predict the changes that are needed to mitigate the timing change nor determine how to affect change only on routes with timing failures. A standard cell library typically provides a set of discrete implementations of each logic function. The different implementations of a particular logic function are designed to drive different capacitive loads while maintaining similar rise/fall times for multiples of a standard load, usually one, two, and four. By choosing from among the cell library cells that drive specific loads, cells driving victim nets may be replaced with a cell having identical function, but the ability to drive a larger load, to balance out the drive of the aggressor net and limit the effects of crosstalk. Current libraries, in general, do not have multiple cell drives that are the same physical size. The cells start at 1×, and the next drive is 2×, having twice the number of "fingers" as in the 1× cell, so the cell is quite a lot larger in physical size. For this reason, upsizing a victim cell to another driver often creates a perturbation in cell placement, requiring adjustments to the physical locations of neighboring cells to accommodate the increased physical size of the new victim driver. This prompts reconnection and re-routing of neighboring nets and thus, invariably introduces new crosstalk violations.

The increase in cell drive also increases the input capacitance of the cell. This can overload the cell driving the net connected to the input of the cell that is being upsized. To fix this, the cell driving the input net would need to be upsized or a buffer would need to be inserted in order to properly drive the additional cell input capacitance. The total set of changes required to adequately repair the crosstalk violation can be quite large, creating a high probability that the repairs will create new crosstalk violations.

It is thus desirable to build a standard cell library that promotes signal integrity by offering multiple cell drives having the same physical size, so that "upsizing" does not always result in the need for restructuring/re-routing that causes additional crosstalk violations.

Some current approaches to crosstalk repair are path based. Path based approaches trigger re-structuring and re-routing to eliminate the effects of crosstalk. Such re-structuring often results in the targeted crosstalk violation being repaired, but many additional violations can be created by the re-routing. Additionally, some current approaches to crosstalk repair involve inserting buffers. Inserting buffers may alleviate the problem, but the buffers create additional delay, which can result in timing that fails as well as can cause additional violations by perturbing the placement and routing required by the process of buffer insertion.

Thus there is a need for a system and method to repair crosstalk violations and ensure signal integrity in a manner that does not induce additional violations.

SUMMARY

The problems noted above are addressed in large part by a system and method for correcting signal integrity crosstalk violations. Some illustrative embodiments may include a system comprising a processor for processing instructions, a memory circuit containing the instructions, the memory circuit coupled to the processor, a mass storage device for holding a design program operable to transfer the design program to the memory circuit, wherein the design program on the mass storage device comprises instructions for a method for repairing crosstalk induced delay on an integrated circuit. The method carried out by the instructions of the design program comprises setting a first threshold value, setting a second threshold value, identifying one or more nets having a reported timing failure, calculating a driver upsize for each net that exceeds the first threshold value or the second threshold value, and swapping the calculated upsize cell in each net.

Other illustrative embodiments may include a computer-implemented tool comprising a standard cell library having one or more cell families comprising one or more cells, each cell having a drive strength, path reporting logic adapted to report one or more failures along one or more nets, threshold logic adapted to set a first threshold value and a second threshold value, and cell swapping logic adapted to exchange a first cell in a failing net for a second cell of the same cell family having a greater drive strength than the drive strength of the first cell, the cell swapping logic triggered by the failing net exceeding the first threshold value or the second threshold value, wherein the cells in each cell family increase in drive strength from the smallest cell according to a mathematical formula.

Yet further illustrative embodiments may include a method of library cell sizing, comprising selecting one or more transistors for a standard cell of a cell family, tuning an output driver transistor, increasing a drive strength for each cell in the cell family according to a mathematical formula, calculating a drive strength multiplier according to the mathematical formula, and calculating one or more actual transistor sizes according to the drive strength multiplier and the standard cell.

Other illustrative embodiments may include a method of crosstalk correction, comprising setting a first threshold value, setting a second threshold value, identifying one or more nets having a reported timing failure, calculating a driver upsize for each net that exceeds the first threshold value or the second threshold value, and swapping the calculated upsize cell in each net.

Yet further illustrative embodiments may include a computer-readable storage medium containing software that, when executed by a processor, causes the processor to set a first threshold value, set a second threshold value, identify one or more nets having a reported timing failure, calculate a driver upsize for each net that exceeds the first threshold value or the second threshold value, and swap the calculated upsize cell in each net.

BRIEF DESCRIPTION OF THE DRAWINGS

For a detailed description of the preferred embodiments of the disclosure, reference will now be made to the accompanying drawings in which:

FIG. 1 illustrates an example of timing delay introduced by crosstalk;

FIG. 2 illustrates a flow diagram of a technique for building a standard cell library, in accordance with at least some embodiments;

FIG. 3 illustrates a flow diagram of a technique for crosstalk violation repair, in accordance with at least some embodiments;

NOTATION AND NOMENCLATURE

Figure 4:
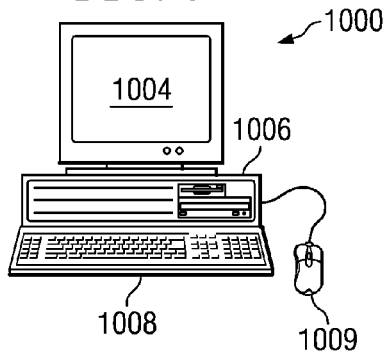
FIG. 4 shows an illustration of a computer system that contains a design program for incorporating aspects of the present disclosure.

Certain terms are used throughout the following discussion and claims to refer to particular system components. This document does not intend to distinguish between components that differ in name but not function.

In the following discussion and in the claims, the terms "including" and "comprising" are used in an open-ended fashion, and thus should be interpreted to mean "including but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers broadly to a collection of two or more components and may be used to refer to an overall system as well as a subsystem within the context of a larger system. Further, the term "software" includes any executable code capable of running on a processor, regardless of the media used to store the software. Thus, code stored in non-volatile memory, and sometimes referred to as "embedded firmware," is included within the definition of software.

A net is typically defined as a collection of pins that need to be electrically connected. A list of all or some of the nets in a layout is referred to as a net list. In other words, a net list specifies a group of nets, which, in turn, specify the interconnections between a set of pins.

The term "victim" refers to a net that is being affected by transitions on a nearby aggressor net. The term "aggressor" refers to a net that is affecting the operation of a nearby net, the victim net.

DETAILED DESCRIPTION OF THE PREFERRED EMBODIMENTS

The following discussion is directed to various embodiments of the disclosure. Although one or more of these embodiments may be preferred, the embodiments disclosed should not be interpreted, or otherwise used, as limiting the scope of the disclosure, including the claims, unless otherwise specified. The discussion of any embodiment is meant only to be illustrative of that embodiment, and not intended to intimate that the scope of the disclosure, including the claims, is limited to that embodiment.

The system and method of the present disclosure include modeling crosstalk effects. The model may then be applied to a mathematical description of a standard cell library to calculate the necessary cell drive strength changes to correct for crosstalk effects on a net-by-bet basis. Current methods of repairing crosstalk violations take a large number of iterations to correct for crosstalk effects, while the present disclosure describes a system and method that preferably corrects for the effects of crosstalk in a single iteration.

New Standard Cell Library

In accordance with one or more embodiments of the present disclosure, a standard cell library may be generated and used. For any given logic function, the drive-strength of the cell can be varied, a fact that may be useful in correcting crosstalk violations. For a typical 300-cell library, each logical function (such as, for example, a 4-input OR gate) will have from 1 to 10 electrical variants, comprising a "cell family." There are, however, millions of possible variations of transistor sizes, producing radically different timing behavior. A cell library as disclosed herein promotes signal integrity by offering multiple cell drives having the same physical size, so that "upsizing" does not always result in the need for restructuring/re-routing that causes additional crosstalk violations.

One characteristic that is significant to timing closure is the choice of cell sizing. Development of a standard cell library in accordance with embodiments of the present disclosure may promote design of layouts wherein crosstalk violations may be handled efficiently. The following attributes are significant in the standard cell library according to the present disclosure:

- A fine granularity of sizes, especially in smallest cell drive range, where granularity is needed most,
- large numbers of drive strengths,
- monotonically increasing drive strengths that follow a mathematical sizing formula, and
- groups of cell drive strengths that are the same size with the same internal metallization and via locations.

The cell sizing methodology may be described as follows, as shown in the block diagram of FIG. 2. The process begins (block 200) with near process minimum N-Channel Field Effect Transistors ("NFETs") and P-Channel Field Effect Transistors ("PFETs") in the smallest standard cells available (block 202). In block 204, the output driver transistor in each cell is tuned such that the weakest drive strength for each cell family (for example nand2, nor2, etc.) has approximately the same ability to drive a load as the weakest drive strength cells for other cell families. The various larger drive strengths for each cell family may be sized such that the increase in size is monotonic (block 206). The increase in size may be calculated (block 206) according to the following formula:

$$(\text{drive gain})^{\text{step size}} = \text{drive strength multiplier}$$

where the drive gain represents to step-by-step multiplier from one drive to the next.

In one embodiment of the cell library, the drive gain value is 1.3. In such a cell library, the smallest drive strength would be represented as A. The B drive is then 1.3 times larger than the A drive. The C drive is then 1.3 times larger than the B drive, and so on. Additionally, the step size is an integer sequence (i.e. 0, 1, 2, 3, 4, . . . ). According to the mathematical formula above, the drive strength multiplier is the total gain accumulated from the minimum drive strength. According to the example explained above, "A" is the minimum sized cell, the "B" drive strength is 1.3 times larger than "A," the "C" drive is 1.69 times larger than "A," and so on. In this example, a drive gain=1.3 is chosen to approximate an ideal CMOS staging ratio (ideal ratio=1/e, approximately 1.3).

From the formula described above, one may calculate the drive strength multipliers (in block 208), and from the multipliers, one may calculate the actual transistor sizes (in block 210) once the transistor size is established for the minimum drive cell. The steps may be repeated (block 212) for each cell family to build the library of available cells and cell families into a standard library to from which cells may be chosen for a design.

A library sized according to the methodology described herein has a fine granularity of drive strengths in the smaller sizes where granularity is most important. As designs in the past have previously used 1× cells to overdrive 70% of the nets in a typical design (thus resulting in many potential aggressors), it is an improvement in the current standard cell library that there is variety in the drive strengths among the smaller sizes that are commonly employed. A large number of drive strengths may be available in the standard cell library of the present disclosure, with a significant number of the smaller cells having identical cell layout polygonal structures above the Polysilicon Contact and Diffusion Contact layers, allows upsizing to occur without changing the routing details and creating additional crosstalk violations. Alternatively, in an embodiment of the present disclosure, drive strengths may increase monotonically with a mathematical progression that has a similar effect to the logarithmic progression described herein.

Crosstalk Correction Flow Algorithm

Employing the cell library described above, a signal integrity correction algorithm according to embodiments of the present disclosure may be used to repair crosstalk induced delay without re-routing that adds additional crosstalk violations. To accomplish signal integrity timing violation repair in a minimum of iterations, and preferably in a single iteration, the coupling induced crosstalk delay may be modeled as a change in the effective capacitance on a net. Changes in the effective capacitance translate into change in the cell's load, and thus directly affect cell delay timing.

The change in effective capacitance is directly proportional to the amount of crosstalk induced delta delay (or delta slew rate) that is reported on a net by a signal integrity analysis tool (such as, for example, PrimeTime Signal Integrity™ or "PTSI™", a tool created and marketed by Synopsys). By comparing the crosstalk induced delta delay (or alternatively the delta slew rate) to the original delay (or original slew rate) through a given cell, one may normalize the change in effective capacitance to the original driver size. Modeling the effective increase in capacitance due to crosstalk enables one to look up the new delay value in library timing tables, the library timing tables having been built upon establishment of the cell library. Using the model, the new delay value matches the value calculated for the delay after the crosstalk effects are taken into account. Using the model and the cell library described herein, it is possible to calculate the drive strength step size necessary to compensate the overall design for crosstalk induced delay.

The model conforms generally to the ASCII equations below:

$$(\text{drive gain})^{\text{step size}} = \text{drive strength multiplier} \quad \text{Eq. 1}$$

$$\text{step size} = \text{Log}(\text{base} = \text{drive gain}) * (\text{drive strength multiplier}) \quad \text{Eq. 2}$$

$$\text{step size} = \ln(\text{drive strength multiplier})/\ln(\text{drive gain}) \quad \text{Eq. 3}$$

$$\text{drive strength multiplier} = 1 + (\text{crosstalk delta cell delay})/(\text{original cell delay}) \quad \text{Eq. 4}$$

$$\text{Step size} = \ln(1 + \text{crosstalk delta cell delay}/\text{original cell delay})/\ln(\text{drive gain}) \quad \text{Eq. 5}$$

Alternatively, crosstalk delta slew values may be used for a similar correction method according to the formula:

$$\text{Step size} = \ln(1 + \text{crosstalk delta slew-rate}/\text{original cell slew-rate})/\ln(\text{drive gain}) \quad \text{Eq. 6}$$

As used in the equations above, the calculated step size is rounded up to the nearest whole integer value. After rounding, step size represents the number of drive strength increments needed for a given library drive gain value in order to fully correct for the crosstalk induced change in delay. In other words, if the drive strength of the cell driving the net is increased by the number of step size increments calculated, the timing on the net will be restored to the original timing value, unaffected by crosstalk. Two examples will further illustrate the benefit of the cell library and method of crosstalk repair of the present disclosure.

Example 1

A computer implemented tool, such as PSTI™ may be used. PSTI™ reports that delay through a given cell is 69% larger than the original delay. Under this circumstance, if the original delay through the cell is 100 ps, the crosstalk delta delay is 69 ps. Assuming that the drive gain value for the chosen cell library is 1.3, then the step size required to restore the original timing would be 2.0. This implies that the drive strength should be incremented by two drive strengths in order to restore the timing. The algorithm is automatically normalized to the current drive strength, so that the increment needed to restore the timing is specified as an increment from the current drive strength.

Example 2

PSTI™ reports that delay through a given cell is twice the original delay. If the original delay through the cell is 100 ps, the crosstalk delta delay is also 100 ps. Assuming that the drive gain value for the chosen cell library is 1.3, the step size necessary to restore the original time would be 2.64. This indicates that the drive strength should be incremented by three drive strengths in order to restore the timing.

An algorithm to carry out the method described above may be employed as shown in FIG. 3. The algorithm begins in block 300, and in block 302, a first threshold value is set. The first threshold value triggers the correction algorithm in circumstances where an upsize in driver is necessary to correct for crosstalk violations, but only when the required upsized driver is the same physical size as the current driver. The first threshold value is based on the ratio of crosstalk delta slew to original slew, or crosstalk delta delay to original delay. In block 304, a second threshold value is set. The second threshold value triggers the correction algorithm in circumstances where the upsize driver is necessary to correct for crosstalk violations, but only when the required upsized driver is larger in physical size than the current driver. The second threshold value is a based on the ratio of crosstalk delta slew to original slew, or crosstalk delta delay to original delay. Preferably, the first threshold value would be the more aggressive value of the two threshold values, meaning that a greater number of drivers will be replaced when the upsized driver is the same physical size as the current driver than if the upsize driver is larger than the current driver. Setting the first and second threshold values allows the user to control the amount of design perturbation (i.e. the amount of design changes required to correct for crosstalk delay) that is acceptable by changing the ratios that trigger upsizes.

In block 306, a computer implemented tool, such as PTSI™ provides path reports that report on all failing paths, and from the report (or the data resulting from a set of queries in PTSI™'s internal command language), a set of nets may be identified that meet the crosstalk delta thresholds (the first and second thresholds set in blocks 302 and 304). According to the equations described above, in block 308 upsize required to restore timing is calculated for each net identified in block 306. A script, such as those generated by design automation programs like Magma Design Automation Inc.'s chip design automation software Blast Fusion™, may be generated to accomplish size swapping. In block 310, upsized drivers are exchanged in the design for the existing drivers. As shown in FIG. 3, the process may iterate as needed, however, preferably, the algorithm, method and system described herein result in successful correction of crosstalk violations with a single iteration of the process shown in FIG. 3.

While upsizing cells in nets having crosstalk violations may have some effects on logic upstream from the net, such effects are generally negligible. Generally, critical paths are driven hard from the start in order to achieve additional savings of picoseconds from such paths, and such paths are usually not victims. The paths that show up among the nets meeting the thresholds are typically less critical, and correcting for the crosstalk effects along such failing paths may render them slightly slower than before. The result of correcting the crosstalk effects, however, is not usually a problem as the paths requiring such correction are usually not the most critical paths where time savings are as meaningful.

Example 3

Results from a Real Design

For a 90 nm ARM 946 core, the normal timing had +108 ps of slack for the worst case setup violation. Using PTSI™, the timing degraded to −125.2 ps of slack for the worst case critical path. Using the crosstalk correction algorithm disclosed herein, most of the crosstalk effects in the design were handled in a single iteration. In a single iteration, the worst case slack improved from −125 ps to +92 ps of slack. This is a significant improvement over traditional approaches that attempt to restructure the entire path to obtain sufficient timing margin without adding additional crosstalk violations.

The System Description

Figure 5:
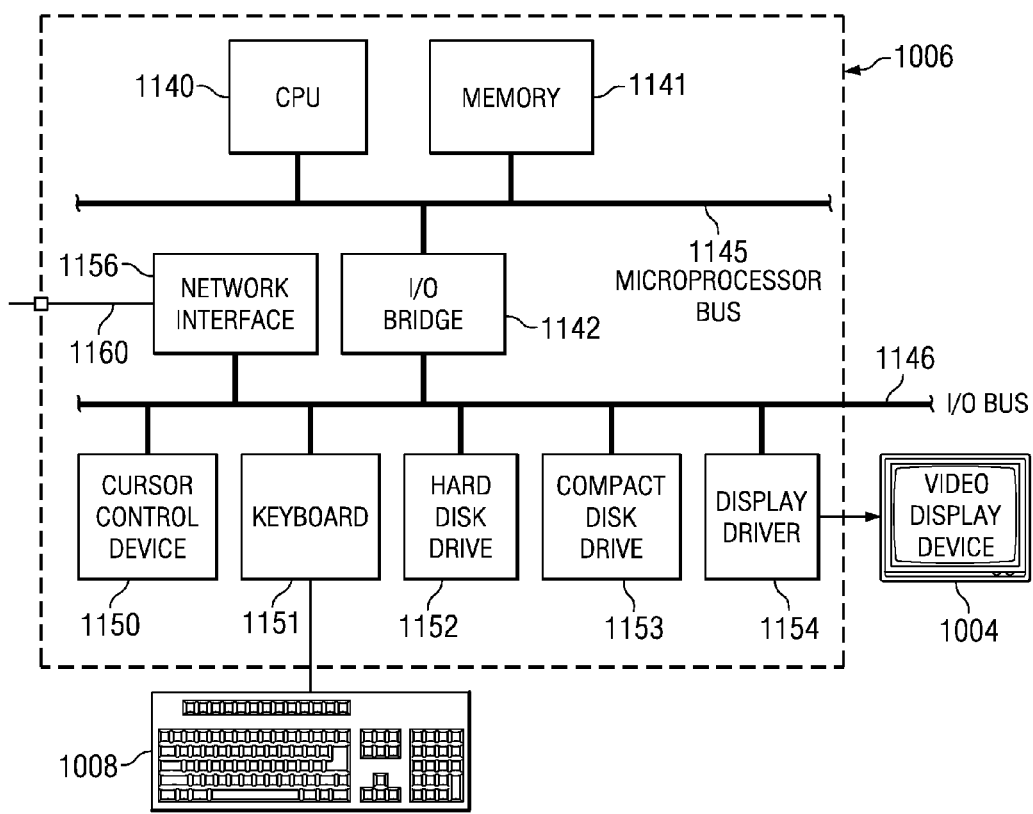
FIG. 5 is a block diagram of the computer of FIG. 5.

FIG. 4 is an illustration of a computer system 1000 which contains a design program incorporating aspects of the present disclosure, and FIG. 5 is a block diagram of the computer of FIG. 4. A design program that contains steps for designing an integrated circuit according to aspects of the present disclosure, as described in the following paragraphs, is stored on a hard drive 1152. This design program can be introduced into a computer 1000 via a compact disk installed in a compact disk drive 1153, or down loaded via network interact 1156, or by other means, such as a floppy disk or tape, for example. The program is transferred to memory 1141 and instructions which comprise the program are executed by processor 1140.

Portions of the integrated circuit design are displayed on monitor 1004. The design program includes a simulator for modeling and extracting parasitic effects and simulating the operation of the integrated circuit according to aspects of the present disclosure.

Figure 6:
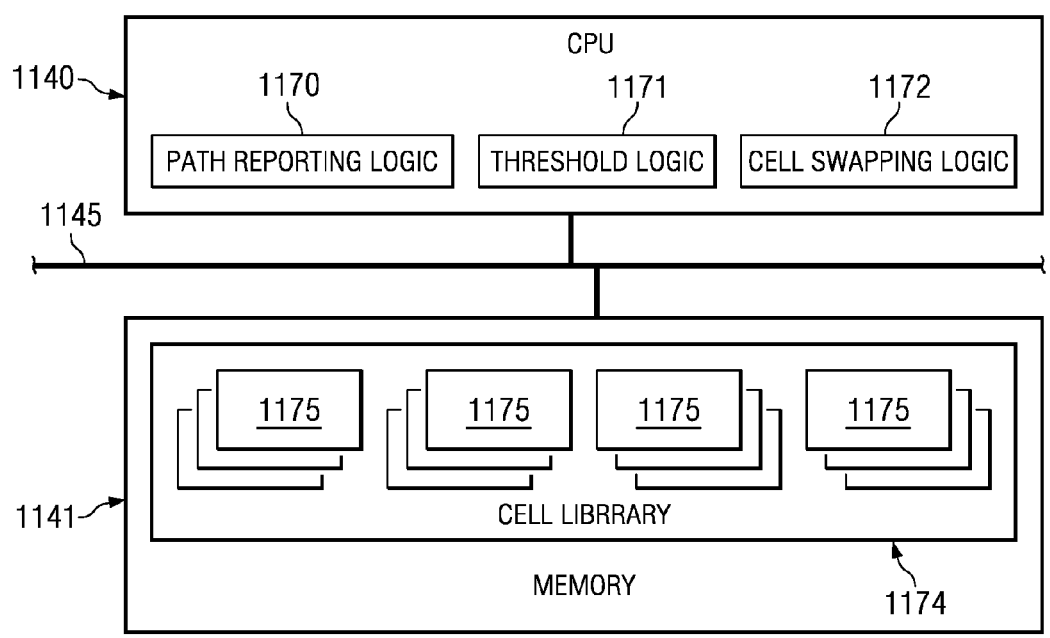
FIG. 6 is a block diagram of various components shown in FIG. 5.

FIG. 6 is a block diagram of various components shown in FIG. 5. The CPU 1140 further comprises various logic components, including the path reporting logic 1170, the threshold logic 1171, and the cell swapping logic 1172. The memory 1141 may store a standard cell library 1174, which may be sized according to methods of the current disclosure. The standard cell library 1174 is comprised of one or more cell families 1175 comprising one or more cells. Each cell of each cell family 1175 has a drive strength.

The above disclosure is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:

a processor for processing instructions;

a memory circuit containing the instructions; the memory circuit coupled to the processor;

a mass storage device for holding a design program operable to transfer the design program to the memory circuit;

wherein the design program on the mass storage device comprises instructions, which when executed by a computer, perform a method for repairing crosstalk induced delay on an integrated circuit, the method comprising:

setting a first threshold value for the crosstalk induced delay;

setting a second threshold value for the crosstalk induced delay;

identifying one or more nets having a reported timing failure based on the first or second threshold value;

calculating a driver upsize for the one or more nets having a reported timing failure based on the first or second threshold value;

wherein the first threshold value triggers the driver upsize when a calculated upsize cell is the same physical size as an existing cell; and wherein the second threshold value triggers the driver upsize when the calculated upsize cell is larger in physical size than the existing cell; and replacing the existing cell with the calculated upsize cell.

2. The system of claim 1, wherein the design program on the mass storage device comprises instructions, which when executed by a computer, perform a method for repairing crosstalk induced delay on an integrated circuit, wherein the first threshold value and the second threshold value are ratios of crosstalk delta slew over original slew.

3. The system of claim 1, wherein the design program on the mass storage device comprises instructions, which when executed by a computer, perform a method for repairing crosstalk induced delay on an integrated circuit, wherein the first threshold value and the second threshold value are ratios of crosstalk delta delay over original delay.

4. A computer-implemented tool, comprising:
a standard cell library having one or more cell families comprising one or more cells, each cell having a drive strength;
path reporting logic adapted to report one or more failures along one or more nets;
threshold logic adapted to set a first threshold value and a second threshold value for cross talk induced delay; and
cell swapping logic adapted to exchange a first cell in a failing net for a second cell of the same cell family having a greater drive strength than the drive strength of the first cell, the cell swapping logic triggered by the failing net exceeding the first threshold value or the second threshold value;
wherein the first threshold value triggers the exchange when the second cell is a same physical size as the first cell;
wherein the second threshold value triggers the exchange when the second cell is larger in physical size than the first cell;
wherein the cells in each cell family increase in drive strength from a smallest cell according to a mathematical formula.

5. The computer implemented tool of claim 4, the path reporting logic is further adapted to report a crosstalk delta slew or a crosstalk delta delay.

6. The computer-implemented tool of claim 4, wherein the first threshold value and the second threshold value are ratios of crosstalk delta slew over original slew.

7. The computer-implemented tool of claim 4, wherein the first threshold value and the second threshold value are ratios of crosstalk delta delay over original delay.

8. A method of crosstalk correction, comprising:
setting a first threshold value for a crosstalk induced delay by using a computer processor;
setting a second threshold value for the crosstalk induced delay by using the computer processor;
identifying one or more nets having a reported timing failure based on the first or second threshold value;
calculating a driver upsize for the one or more nets having a reported timing failure based on the first or second threshold value;
wherein the first threshold value triggers the driver upsize when a calculated upsize cell is the same physical size as an existing cell; and
wherein the second threshold value triggers the driver upsize when the calculated upsize cell is larger in physical size than the existing cell; and
replacing the existing cell with the calculated upsize cell.

9. The method of claim 8, wherein the first threshold value and the second threshold value are ratios of crosstalk delta slew over original slew.

10. The method of claim 8, wherein the first threshold value and the second threshold value are ratios of crosstalk delta delay over original delay.

11. The method of claim 8, wherein delay buffers are not added to the nets having a reported timing failure in order to correct for one or more timing violations.

12. The method of claim 8, wherein the reported timing failure is a setup violation.

13. The method of claim 8, wherein the reported timing failure is a hold violation.

14. A computer-readable storage medium containing software that, when executed by a processor, causes the processor to:
set a first threshold value for crosstalk induced delay;
set a second threshold value for the crosstalk induced delay;
identify one or more nets having a reported timing failure based on the first or second threshold value;
calculate a driver upsize for the one or more nets having a reported timing failure based on the first or second threshold value;
wherein the first threshold value triggers the driver upsize when a calculated upsize cell is the same physical size as an existing cell;
wherein the second threshold value triggers the driver upsize when the calculated upsize cell is larger in physical size than the existing cell; and
replace the existing cell with the calculated upsize cell.

15. The computer-readable storage medium containing software of claim 14, wherein the first threshold value and the second threshold value are ratios of crosstalk delta slew over original slew.

16. The computer-readable storage medium containing software of claim 14, wherein the first threshold value and second threshold values are ratios of crosstalk delta delay over original delay.

17. The computer-readable storage medium containing software of claim 14, wherein reported timing failure is a setup violation.

18. The computer-readable storage medium containing software of claim 14, wherein reported timing failure is a hold violation.

* * * * *

UNITED STATES PATENT AND TRADEMARK OFFICE
CERTIFICATE OF CORRECTION

PATENT NO. : 7,644,383 B2
APPLICATION NO. : 11/172284
DATED : January 5, 2010
INVENTOR(S) : Bartling et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 577 days.

Signed and Sealed this

Twenty-first Day of December, 2010

David J. Kappos
*Director of the United States Patent and Trademark Office*